United States Patent
Freeman et al.

(10) Patent No.: US 6,461,667 B1
(45) Date of Patent: Oct. 8, 2002

(54) APPARATUS AND METHOD FOR VAPOR DEPOSITING LUBRICANT COATING ON A WEB

(75) Inventors: Dennis R. Freeman, Spencerport; Christine J. Landry-Coltrain, Fairport, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/542,720

(22) Filed: Apr. 4, 2000

(51) Int. Cl.[7] .............................................. C23C 14/00
(52) U.S. Cl. .................... 427/8; 427/255.5; 427/299; 427/444; 118/666; 118/667; 118/708; 118/712; 118/718; 118/724; 118/726
(58) Field of Search ................................ 427/127, 177, 427/209, 248.1, 255.5, 255.6, 294, 402, 8, 299, 444; 430/935; 118/718, 724, 726, 666, 667, 708, 712

(56) References Cited

U.S. PATENT DOCUMENTS

| | | | | |
|---|---|---|---|---|
| 2,074,281 A | * | 3/1937 | Somer | 427/531 |
| 2,562,182 A | * | 7/1951 | Godley | 118/718 |
| 3,086,889 A | * | 4/1963 | Strong | 118/726 |
| 3,333,981 A | * | 8/1967 | Kinsella | 118/18 |
| 4,451,501 A | * | 5/1984 | Nagao | 427/531 |
| 5,076,203 A | * | 12/1991 | Vaidya | 118/726 |

OTHER PUBLICATIONS

Webster's New Collegiate Dictionary, Merriam–webster, 1975, pp. 3 and 617.*

* cited by examiner

*Primary Examiner*—Richard Bueker
(74) *Attorney, Agent, or Firm*—Doreen M. Wells

(57) ABSTRACT

A vacuum lubricant deposition station coats a lubricant onto the back side of a moving web prior to coating the front side with emulsions. The deposition station has a sidewall creating a chamber containing a heat source along its bottom and an evaporating tray above the heater which holds the lubricant to be vacuum vapor deposited on the web. A water cooled jacket fits about the top of the sidewall and receives the film through a narrow slot between its top and bottom plates to expose the back side of the film to a vapor cloud of lubricant in the chamber. Lubricant from the cloud deposits on the back side of the web. Stray lubricant from the cloud condenses on the bottom plate which receives cooling water through an inlet. The cooling water traverses the length of the bottom plate, enters the top plate through a water loop connecting the top and bottom plates, and exits through the top plate. The vapor cloud condenses on the bottom plate before reaching the front side of the film.

20 Claims, 1 Drawing Sheet

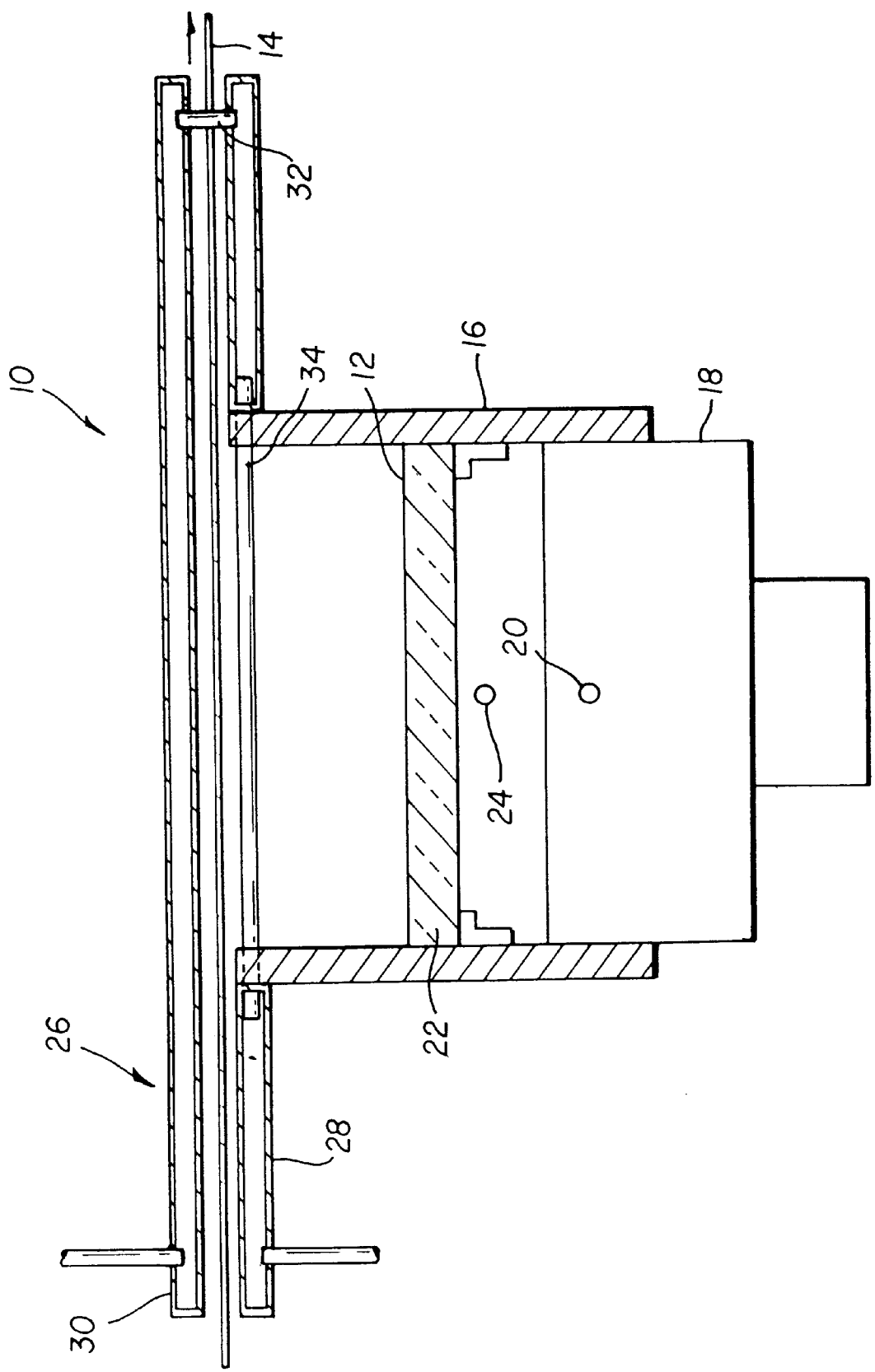

APPARATUS AND METHOD FOR VAPOR DEPOSITING LUBRICANT COATING ON A WEB

FIELD OF THE INVENTION

The present invention relates generally to photographic media, and, more particularly, to an apparatus and method for applying a lubricant coating over a magnetic coating on a web.

BACKGROUND OF THE INVENTION

A magnetic recording layer is included in the composition of photographic film for recording identification data or other data. The magnetic layer is coated with a lubricating layer which protects the magnetic recording layer and allows the films to be thrust in and out of a film cartridge without damage. Photographic film is typically constructed by building the various layers on a substrate using transport rollers during the manufacture to move the substrate as a web from one layering station to the next. Because the total thickness of the layered film is on the order of 0.004 inch (0.1 mm), each layer is extremely thin, and must be applied carefully to maintain uniformity and prevent over spray or splattering. One process for applying a thin layer of material to a substrate is vacuum vapor deposition. It is desirable to use a vapor deposition process to apply a thin, uniform lubricating layer. A problem with vapor deposition is that the vapor cloud can collect on surfaces other than the magnetic layer thereby contaminating the film. It is therefore desirable to have an apparatus that prevents free vapor from contaminating the web or vacuum chamber.

SUMMARY OF THE INVENTION

According to one aspect of the present invention, a lubricant deposition station coats a lubricant onto the back side of a moving web of photographic film prior to coating the front side with emulsions. The deposition station has a sidewall creating a chamber containing a heat source along its bottom and an evaporating tray above the heater which holds the lubricant material to be vacuum vapor deposited on the film. The web is threaded through the system such that the back or target side of the web is exposed to the open tray of heated lubricant material while being transported through the vacuum deposited lubricant station. A water cooled jacket fits about the top of the sidewall and receives the film through a narrow slot between its top and bottom plates to expose the back side of the film to a vapor cloud of lubricant in the deposition station. Lubricant from the vapor cloud deposits on the back side of the film. Stray lubricant from the cloud condenses on the bottom plate which receives cooling water through an inlet. The cooling water traverses the length of the bottom plate, enters the top plate through a water loop connecting the top and bottom plates, and exits through the top plate. The vapor cloud condenses on the bottom plate without reaching the front side of the film.

BRIEF DESCRIPTION OF THE DRAWING

The drawing is a cross-sectional view of a preferred embodiment of a vapor deposition station according to the present invention.

DETAILED DESCRIPTION OF THE INVENTION

Referring to the drawing, a vacuum deposited lubricant (VDL) station 10 deposits a lubricant 12 onto a surface of a moving web 14 of photographic film positioned in the web path. The entire web path may be housed in a vacuum chamber or only the VDL station may be in a vacuum chamber. Typically, the web is unwound from a supply roll and fed to coating stations and wound on a take-up roll. Idler rollers along the web path maintain web tension, and a preheater may be employed to heat the web on its way to the coating stations. The supply and take-up rolls, as well as the tensioning rollers and preheater, may be housed in a vacuum chamber, or only the coating stations may be housed in a controlled environment.

The VDL station 10 includes an upstanding sidewall 16 which has a top portion, a bottom portion and a middle portion intermediate the top and bottom portions. The sidewall is closed to form an interior chamber. The sidewall is preferably constructed of four sidewall panels connected together to form a boxy structure. Aluminum, steel or other metal is suitable for the boxy structure.

A heater 18 positioned along the bottom portion of the sidewall forms a bottom closure for the sidewall. Heater 18 may use an electron gun, sputter cathode, resistance heater or other device as a heat source. A temperature measuring device, such as thermocouple 20, is a part of or located in close proximity to heater 18 to facilitate temperature control.

A material evaporation tray 22, preferably quartz, is positioned in the chamber at the middle portion of the sidewall for holding the lubricant that is to be vapor deposited on the web. A second temperature measuring device, such as thermocouple 24, is located in the chamber at or near tray 22. By monitoring temperature at the evaporation tray and heater with thermocouples 20, 24, heater output can be controlled so that optimum temperature for vapor deposition is maintained. Where the lubricant is a fluorocarbon polymer such as polytetrafluoroethylene (PTFE) or fluorinated ethylene propylene polymer (FEP), the operating temperature is in the range of about 550° C. to about 650° C.

A water cooled jacket 26 is positioned along the top portion of the sidewall 16 forming a top closure for the sidewall. Jacket 26 has an elongated opening therethrough for receiving the web 14. Preferably, jacket 26 top and bottom plate 28, 30 that are spaced from one another creating a gap therebetween. The gap is on the order of 0.02 inches (0.508 mm), and web 14 that travels through the gap is on the order of 0.004 inches (0.1 mm). Plates 28, 30 are preferably constructed of steel or other metal and have a hollow interiors that form a water passageway. Bottom plate 28 has a water inlet and top plate 30 has a water outlet. The inlet and outlet are positioned on corresponding ends of the plates and the other, distal, ends of the plates are connected by a water loop 32, such as a piece of metal or rubber tubing. Water flows from the water inlet through the entire length of the bottom plate to the loop and on through the entire length of the top plate to exit through the water outlet. Water flow is regulated by a water pump/recirculating chiller.

Top and bottom plates 30, 28 extend longitudinally along the web path and need to extend laterally only a distance slightly greater than the width of the web. The plates will be wide enough to form a closure for the sidewall 16, but need not be wider. Bottom plate 28 may be divided into first and second sections fitted about the top portion of the sidewall with the first and second sections connected to one another by a water loop or a pair of water loops 34.

During operation of the VDL station 10, the web 14 enters the slot in water cooled jacket 26. When web 14 is over the heater 18 and evaporation tray 22, it is in the area of a vapor cloud of the lubricant 12. The heater heats the lubricant in the tray causing it to vaporize as the temperature is monitored and controlled by the thermocouples 20, 24. Lubricant is deposited on only one side of the web, the side over the chamber exposed to the lubricant vapor.

Because the gap between the jacket's top and bottom plates is greater than the thickness of the web, lubricant vapor could escape to contaminate the other side of the web or manufacturing equipment. Contamination is prevented, however, by the water cooled jacket which creates a surface on the plates to condense vapor that is not deposited on the bottom side of the web. Cooling water entering the jacket enters the bottom plate and is warmed as it travels through the bottom plate, water loop and finally the top plate. By monitoring the water flow rate and temperature, it is possible to condense almost all of the vapor on the bottom plate keeping it well away from the top surface of the web. After deposition of the lubricant, the web is wound up on itself where the lubricant coated bottom side is in contact with the top side that is yet to be emulsion coated. Evaluations have shown that when the emulsion layer is coated onto the top surface of the lubricated web, the adhesion of the emulsion is not affected by the lubricant layer contact. The inference is that there is no lubricant to top side transfer, which inference has been confirmed by X-ray photospectroscopy and by testing the adhesion strength of a photographic emulsion layer that was applied post-VDL treatment, to the support on the side opposite of the VDL layer.

It can now be appreciated that an apparatus and method have been presented for vacuum depositing a layer of lubricant onto a moving web of material. The apparatus includes a chamber with a heater and material evaporation tray in the chamber to heat the lubricant creating a lubricant vapor cloud in the chamber. A water jacket forms a top cover for the chamber. A slot in the jacket receives the web and exposes the bottom side of the web to the lubricant vapor cloud. Vaporized lubricant that is not deposited on the web is condensed by the bottom plate of the water jacket. Periodic cleaning removes the condensed lubricant with minimal interference with the manufacturing process.

The method includes forming a chamber defined by an upstanding sidewall with the sidewall having a top portion, a bottom portion and a middle portion intermediate the top and bottom portions; positioning a tray in the chamber at the middle portion of the sidewall for holding the material to be vapor deposited; positioning a heater along the bottom portion of the sidewall forming a bottom closure for the cavity; and forming a water cooled jacket about the sidewall with the jacket having an elongated opening therethrough for receiving the web and positioned along the top portion of the sidewall forming a top closure for the sidewall. The jacket is formed of a top plate and a bottom plate. The method includes forming a water inlet in the bottom plate and a water outlet in the top plate, forming a water loop to connect the top and bottom plates, and circulating water from the water inlet through the bottom plate to the loop and on to the top plate to exit through the water outlet. Positioning the loop near an end of the top and bottom plates distal from the water inlet and water outlet forces cooling water to traverse the entire length of the plates. Dividing the bottom plate into first and second sections fitted about the top portion of the sidewall and connecting the first and second sections to one another with a water loop provides a water path without substantially increasing the width of the jacket beyond the sidewall. The method also includes regulating temperature in the chamber by installing a first thermocouple and monitoring temperature of the heater, and installing a second thermocouple and monitoring temperature in the chamber near the tray.

While the invention has been described with particular reference to the preferred embodiments, it will be understood by those skilled in the art that various changes may be made and equivalents may be substituted for elements of the preferred embodiments without departing from invention. For example, the water inlet and outlet may be reversed so that cooling water enters through the top plate instead of the bottom plate. In such case, increasing the water flow rate will achieve the desired cooling effect. And while the present invention has been described with reference to a vacuum chamber, a total vacuum is not necessary. Moderate vacuum will achieve satisfactory results. Other modifications in the equipment can be accommodated by varying the temperature and web speed to obtain the desired lubricant thickness and uniformity. It is accordingly intended that the claims shall cover all such modifications and applications as do not depart from the true spirit and scope of the invention.

What is claimed is:

1. An apparatus for depositing a material onto a surface of a moving web, comprising:

an upstanding sidewall having a top portion, a bottom portion and a middle portion intermediate said top and bottom portions, said sidewall being closed forming an interior chamber;

a tray positioned in said interior chamber at said middle portion of said sidewall for holding said material to be vapor deposited;

a heater positioned along said bottom portion of said sidewall forming a bottom closure for said sidewall; and a water cooled jacket having an elongated opening therethrough for receiving said web, said jacket being positioned along said top portion of said sidewall forming a top closure for said sidewall and preventing lubricant vapor from escaping from the interior chamber.

2. An apparatus, as set forth in claim 1, wherein said water jacket includes a top plate and a bottom plate.

3. An apparatus, as set forth in claim 2, including a water inlet in said bottom plate and a water outlet in said top plate.

4. An apparatus, as set forth in claim 3, including a loop connecting said top and bottom plates so that water flows from said water inlet through said bottom plate to said loop and on to said top plate to exit through said water outlet.

5. An apparatus, as set forth in claim 4, wherein said loop is positioned near an end of said top and bottom plates distal from said water inlet and water outlet.

6. An apparatus, as set forth in claim 2, including a water inlet in one of said top and bottom plates and a water outlet in the other of said top and bottom plates; and a loop connecting said top and bottom plates so that water flows from said water inlet through said one of said top and bottom plates to said loop and on to said other one of said top and bottom plates to exit through said water outlet, said loop being positioned near an end of said top and bottom plates distal from said water inlet and water outlet.

7. An apparatus, as set forth in claim 2, wherein said bottom plate is divided into first and second sections fitted about said top portion of said sidewall with said first and second sections connected to one another by a water loop.

8. An apparatus, as set forth in claim 2, wherein said top and bottom plates are spaced from one another a distance of about 0.020 inches (0.508 mm).

9. An apparatus, as set forth in claim 1, including means for regulating temperature in said chamber.

10. An apparatus, as set forth in claim 1, including a first thermocouple for monitoring temperature of said heater, and a second thermocouple for monitoring temperature in said chamber near said tray.

11. A method for vacuum vapor depositing a material onto a surface of a moving web, comprising the steps of:

forming a chamber defined by an upstanding sidewall, said sidewall having a top portion, a bottom portion and a middle portion intermediate said top and bottom portions;

positioning a tray in said chamber at said middle portion of said sidewall for holding said material to be vapor deposited;

positioning a heater along said bottom portion of said sidewall forming a bottom closure for said cavity; and forming a water cooled jacket about said sidewall, said jacket having an elongated opening therethrough for receiving said web, said jacket being positioned along said top portion of said sidewall forming a top closure for said sidewall.

12. The method according to claim 11 including the step of forming said jacket of a top plate and a bottom plate.

13. The method according to claim 12 including the step of forming a water inlet in said bottom plate and a water outlet in said top plate.

14. The method according to claim 13 including the steps of:

forming a loop and connecting said top and bottom plates; and circulating water from said water inlet through said bottom plate to said loop and on to said top plate to exit through said water outlet.

15. The method according to claim 14 including the step of positioning said loop near an end of said top and bottom plates distal from said water inlet and water outlet.

16. The method according to claim 12 including the steps of:

forming a water inlet in one of said top and bottom plates and a water outlet in the other of said top and bottom plates;

forming a loop and positioning said loop near an end of said top and bottom plates distal from said water inlet and water outlet thereby connecting said top and bottom plates; and circulating water from said water inlet through said one of said top and bottom plates to said loop and on to said other one of said top and bottom plates to exit through said water outlet.

17. The method according to claim 12 including the steps of:

dividing said bottom plate into first and second sections fitted about said top portion of said sidewall; and connecting said first and second sections to one another with a water loop.

18. The method according to claim 12 including the step of spacing said top and bottom plates from one another a distance of about 0.020 inches (0.508 mm).

19. The method according to claim 11 including the step of regulating temperature in said chamber.

20. The method according to claim 11 including the steps of:

installing a first thermocouple and monitoring temperature of said heater, and installing a second thermocouple and monitoring temperature in said chamber near said tray.

* * * * *